(12) United States Patent
Engl et al.

(10) Patent No.: US 10,641,837 B2
(45) Date of Patent: May 5, 2020

(54) RIPPLE MONITORING

(71) Applicant: LINEAR TECHNOLOGY CORPORATION, Milpitas, CA (US)

(72) Inventors: Bernhard Helmut Engl, Colorado Springs, CO (US); Robert Chiacchia, Colorado Springs, CO (US); Robert C. Dobkin, Milpitas, CA (US)

(73) Assignee: Linear Technology Corporation, Milpitas, CA (US)

( * ) Notice: Subject to any disclaimer, the term of this patent is extended or adjusted under 35 U.S.C. 154(b) by 654 days.

(21) Appl. No.: 15/153,222

(22) Filed: May 12, 2016

(65) Prior Publication Data

US 2017/0153296 A1   Jun. 1, 2017

Related U.S. Application Data

(60) Provisional application No. 62/261,032, filed on Nov. 30, 2015.

(51) Int. Cl.
*G01R 31/40* (2020.01)
*G01R 31/42* (2006.01)
(Continued)

(52) U.S. Cl.
CPC ......... *G01R 31/40* (2013.01); *G01R 19/0084* (2013.01); *G01R 31/42* (2013.01);
(Continued)

(58) Field of Classification Search
CPC ..... G01R 19/0084; G01R 31/40; G01R 31/42
See application file for complete search history.

(56) References Cited

U.S. PATENT DOCUMENTS 5,122,719 A * 6/1992 Bessenyei ............... H02P 6/06
                                                    318/602
5,256,949 A * 10/1993 Reichard .................. H02P 6/15
                                                    318/400.01
(Continued)

FOREIGN PATENT DOCUMENTS

CN         1805274 A      7/2006
CN       200996992 Y     12/2007
(Continued)

OTHER PUBLICATIONS

"European Application Serial No. 16871185.1, Response filed Oct. 5, 2018 to Communication pursuant to Rules 161(2) and 162 EPC dated Jul. 6, 2018", w/ English Claims, 9 pgs.
(Continued)

*Primary Examiner* — Son T Le
*Assistant Examiner* — Adam S Clarke
(74) *Attorney, Agent, or Firm* — Schwegman Lundberg & Woessner, P.A.

(57) ABSTRACT

A ripple monitoring circuit may generate information indicative of a failing component in a power supply. At least one input may receive a ripple signal from the power supply that has a ripple component. A quantization circuit may repeatedly quantize the amplitude of the ripple component. A ripple amplitude statistics counter bank may count and store the number of times that different quantized amplitudes or different ranges of quantized amplitudes of the ripple component occurred.

A ripple monitoring circuit may generate information about a power supply. At least one input may receive a ripple signal from the power supply that has a ripple component. A ripple measurement circuit may measure a characteristic of the ripple component. A storage circuit may store information about the measurement. A comparison circuit may compare information stored in the storage circuit with a (Continued)

threshold value and indicate when the stored information meets or exceeds this threshold value.

27 Claims, 7 Drawing Sheets

(51) Int. Cl.
  *G01R 19/00* (2006.01)
  *H03M 1/12* (2006.01)
  *H03M 1/66* (2006.01)

(52) U.S. Cl.
  CPC ............ *H03M 1/12* (2013.01); *H03M 1/1295* (2013.01); *H03M 1/66* (2013.01)

(56) References Cited

U.S. PATENT DOCUMENTS

| | | |
|---|---|---|
| 6,275,161 B1 | 8/2001 | Wan et al. |
| 7,148,808 B1 | 12/2006 | Pfahlert et al. |
| 7,817,051 B2 | 10/2010 | Cheng et al. |
| 8,310,185 B2 | 11/2012 | Knezevic et al. |
| 8,924,170 B2 | 12/2014 | Bengtsson et al. |
| 2008/0030268 A1 | 2/2008 | Quilter |
| 2008/0067993 A1* | 3/2008 | Coleman ................ H02M 1/15 323/282 |
| 2008/0180087 A1* | 7/2008 | Pankau ................ H02H 3/253 324/76.74 |
| 2014/0077873 A1* | 3/2014 | Motz ................ H03F 3/387 330/9 |
| 2014/0091783 A1* | 4/2014 | Cotton ................ G01R 31/362 324/76.39 |
| 2014/0333281 A1* | 11/2014 | Li ................ G06F 1/3203 323/318 |
| 2018/0041118 A1* | 2/2018 | Cohen ................ H02M 1/08 |

FOREIGN PATENT DOCUMENTS

| | | |
|---|---|---|
| CN | 105191092 A | 12/2015 |
| CN | 108603919 A | 9/2018 |
| EP | 3384301 A1 | 10/2018 |
| JP | 2002247859 | 8/2002 |
| JP | 2010104148 | 5/2010 |
| JP | 6615999 | 11/2019 |
| TW | I260411 B | 8/2006 |
| TW | I431910 B | 3/2014 |
| WO | WO-2017095474 A1 | 6/2017 |

OTHER PUBLICATIONS

"International Application Serial No. PCT/US2016/032723, International Preliminary Report on Patentability dated Jun. 14, 2018", 11 pgs.

"International Application Serial No. PCT/US2016/032723, International Search Report dated Aug. 18, 2016", 2 pgs.

"International Application Serial No. PCT/US2016/032723, Written Opinion dated Aug. 18, 2016", 9 pgs.

"Japanese Application Serial No. 2018-527920, Office Action dated Apr. 17, 2019", w English translation, 12 pgs.

"European Application Serial No. 16871185.1, Extended European Search Report dated Jul. 2, 2019", 14 pgs.

"Japanese Application Serial No. 2018-527920, Notification of Reasons for Rejection dated Jul. 1, 2019", w/ English Translation, 7 pgs.

"Japanese Application Serial No. 2018-527920, Response filed Jun. 4, 2019 to Office Action dated Apr. 17, 2019", w/ English Claims, 14 pgs.

"Japanese Application Serial No. 2018-527920, Response filed Oct. 1, 2019 to Notification of Reasons for Rejection dated Jul. 1, 2019", w/ English Claims, 9 pgs.

"Taiwanese Application Serial No. 105115760, Office Action dated Aug. 26, 2019", w/ English Translation, 24 pgs.

"Taiwanese Application Serial No. 105115760, Response filed Nov. 19, 2019 to Office Action dated Aug. 26, 2019", w/ English Claims, 17 pgs.

"Chinese Application Serial No. 201680080526.2, Office Action dated Mar. 4, 2020", w/ English Translation, 12 pgs.

* cited by examiner

RIPPLE MONITORING

CROSS-REFERENCE TO RELATED APPLICATION

This application is based upon and claims priority to U.S. provisional patent application 62/261,032, entitled "System and Method for Ripple Monitoring," filed Nov. 30, 2015. The entire content of this application is incorporated herein by reference.

BACKGROUND

Technical Field

This disclosure relates to ripple monitoring systems and methods that may be embedded in an integrated circuit ("IC"). The ripple monitoring may be used to monitor power supply operations.

Description of Related Art

Power supplies of high performance microprocessors or high density ASICs or FPGAs, commonly referred to as "switching power supplies," may have demanding specifications for line and load regulation, load transient response, and/or residual ripple voltage caused by their inherent switching operation.

Electrical components in such power supplies may degrade which, in turn, may impair the ability of the power supplies to meet one or more specifications. Ageing electrolytic capacitors, for example, can be particularly problematic. Due to electrolyte evaporation or other aging processes over their operational lifetime, their equivalent series resistance (ESR) may increase and their capacitance may decrease. This may cause the affected power supply to operate unreliably.

Operating from an out-of-spec power supply may cause random failures, such as occasional memory loss, false calculations, tripping of watchdog timers, and/or a need to reset and/or reboot the entire system from time to time. Such failures may occur rarely at first, and only under specific temperature, line or load conditions. They may be hard or almost impossible to catch by common power supply supervisor ICs, as their trip points may be set to detect out-of-spec power supply voltages. But by then, it may be too late, especially for high reliability and/or high availability systems.

Fast comparators can be found in some IC products, known as "Power Supply Managers," such as the LTC2978 of Linear Technology Corporation ("LTC"). These may be user programmed to stringent trip points. However, this approach to detect degrading power supplies before the system fails can be a tightrope walk at best, between false alarms happening too often, and not being able to detect an unfolding problem soon enough. This may be due to the mixed nature of the power supply ripple, which may have ripple components caused by switching power supply operation and by varying or periodic load currents and/or load current transients, and the two state nature of any comparator output signal not being able to convey much supporting information.

SUMMARY

A ripple monitoring circuit may generate information indicative of a failing component in a power supply. At least one input may receive a ripple signal from the power supply that has a ripple component. A quantization circuit may repeatedly quantize the amplitude of the ripple component. A ripple amplitude statistics counter bank may count and store the number of times that different quantized amplitudes or different ranges of quantized amplitudes of the ripple component occurred.

A ripple monitoring circuit may generate information about a power supply. At least one input may receive a ripple signal from the power supply that has a ripple component. A ripple measurement circuit may measure a characteristic of the ripple component. A storage circuit may store information about the measurement. A comparison circuit may compare information stored in the storage circuit with a threshold value and indicate when the stored information meets or exceeds this threshold value.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
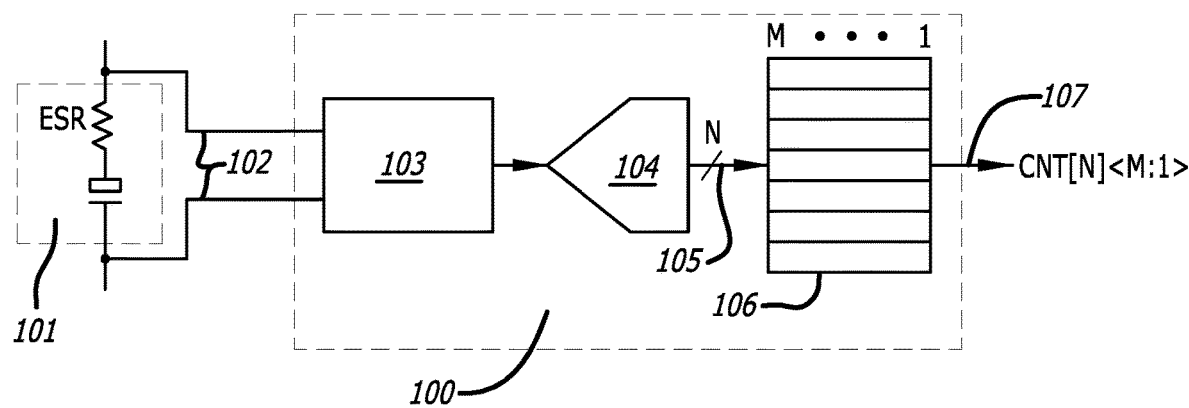
FIG. 1 illustrates an example of a ripple monitoring circuit.

FIG. 1 illustrates an example of a ripple monitoring circuit 100. The ripple monitoring circuit 100 may collect amplitude statistics of voltage ripple in a ripple signal 102 from a power supply whose operational fitness is to be monitored, such as the signal across an output capacitor or other output of the power supply. This circuit may be part of an integrated circuit (IC).

The ripple monitoring circuit 100 may be coupled to an electrolytic capacitor 101 in the power supply, which might cause failure of the power supply due to ageing properties, such as an increase in its equivalent series resistance (ESR). This may manifest itself as an increase in the ripple voltage across the capacitor.

However, the actual ripple voltage may be caused by a mixture of components with different types of problems, and may vary over time, temperature, and/or over load conditions. As a result, simple monitoring methods, such as rectification of the AC component, peak detection, and comparison to a fixed threshold by means of a comparator, may not be able to provide information sufficient to accurately assess power supply health.

The circuit illustrated in FIG. 1 may address these concerns. A ripple signal 102 from the power supply may contain a ripple component. The ripple signal 102 may be differential, as shown in FIG. 1, or single ended. The ripple signal 102 may be conditioned by a conditioning circuit 103, which may condition the ripple signal so that it can be processed by an analog-to-digital converter 104 ("ADC").

The ADC may have N output bits 105 which may be coupled to an amplitude statistics counter bank 106. The amplitude statistics counter bank 106 may include a counter of M bits for each of the 2^N possible output code combinations of the ADC, or for a subset thereof. Accumulated counts 107, denoted in FIG. 1 as CNT[N]<M:1>, may be a final result of the ripple monitoring process or may be subject to further processing before the result is presented to a host system in which the ripple monitor circuit is located or to which it is connected. The accumulated counts 107 may represent a statistical distribution of the ripple amplitudes, which can be compared against previous statistical distributions taken earlier in the life of the power supply, to detect signs of degradation of performance of the power supply. Some statistical properties that may be relevant for this purpose are the peak-to-peak ripple, or the ripple magnitude after applying a slicing level that ignores ripple components having lower counts, or the mathematical standard deviation of the ripple counts. These statistical properties can be readily derived from analyzing the contents of the accumulated count registers using known mathematical procedures. The current results then can be compared against preset thresholds or against results obtained earlier in the life of the power supply. Any significant widening of peak-to-peak ripple, sliced ripple magnitude or the standard deviation of the ripple counts exceeding a pre-set threshold may be used to issue an alert in the system that is supplied by the power supply, long before the degradation of the power supply gets to a point where system functionality is impaired. Preventive maintenance then could swap the power supply against a new one whenever maintenance schedules do fit, avoiding unexpected failures and downtimes of the system.

The signal conditioning circuit 103 may be implemented in different ways. The signal conditioning circuit 103 may provide high pass filtering, low pass filtering, DC level removal, DC level restoration, amplification, a sample/hold function for an ADC (discussed below), or any combination of these.

Figure 2:
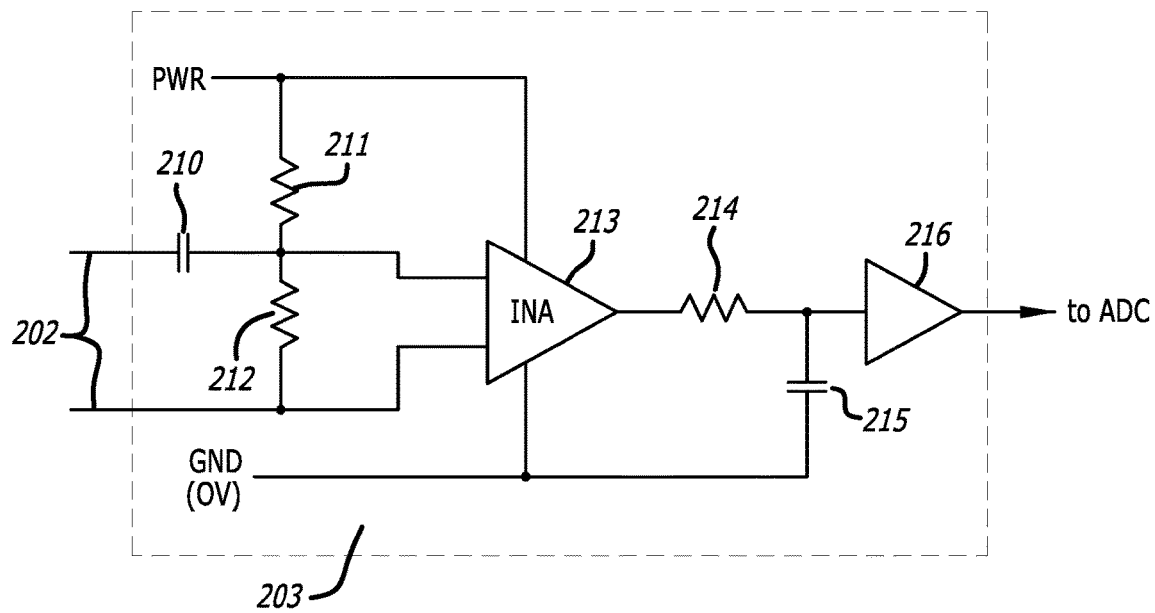
FIG. 2 illustrates an example of a prior art signal conditioning circuit that may be used for the signal conditioning circuit shown in FIG. 1.

FIG. 2 illustrates an example of a prior art signal conditioning circuit 203 that may be used for the signal conditioning circuit 103 shown in FIG. 1. A differential sample 202 from the power supply, such as the ripple signal 102 shown in FIG. 1, may be passed through a coupling capacitor 210, which may remove any DC component in the ripple signal 202. Resistors 211 and 212 may act to restore a DC bias signal level at the inputs of an instrumentation amplifier (INA) 213. These resistors and the capacitor 210 may function as a high pass filter of the ripple signal 202.

The INA 213 may remove any common mode signal that may be present, which may be a ground potential disturbance at the origin of the ripple signal 202, and may amplify its differential ripple signal component. An INA output may be coupled to a low pass filter, which may be formed by a resistor 214 and a capacitor 215, which may act as an antialiasing filter for the ADC. A buffer amplifier 216 may decouple the low pass filter and provide the driving strength for the ADC inputs. The buffer amplifier 216 may be a simple unity gain level shifter.

Figure 3:
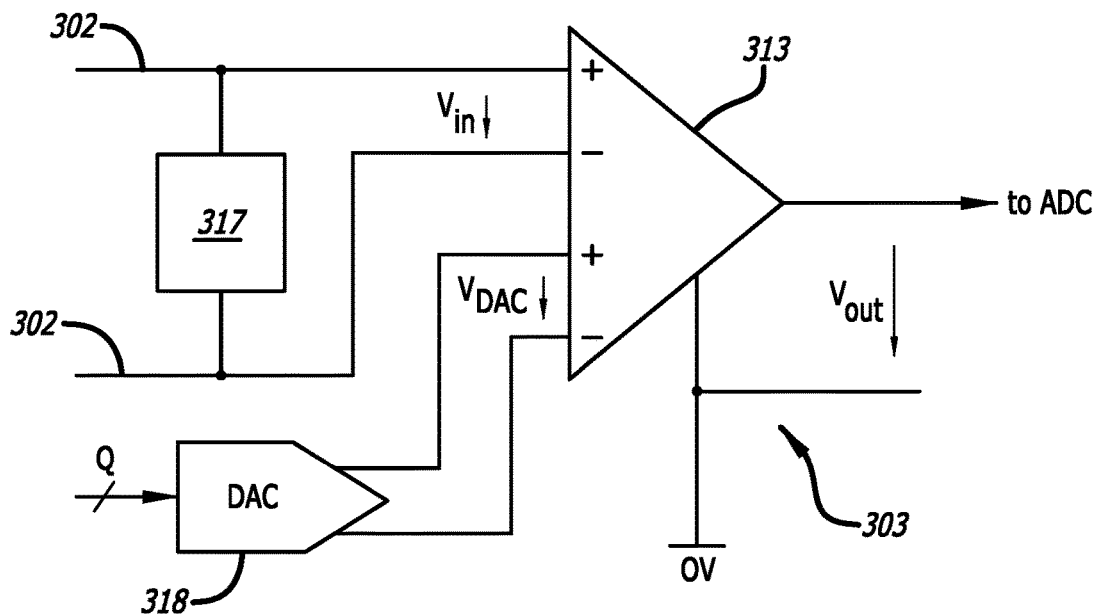
FIG. 3 illustrates another example of a signal conditioning circuit that may be used for the signal conditioning circuit shown in FIG. 1.

FIG. 3 illustrates another example of a signal conditioning circuit 303 that may be used for the signal conditioning circuit 103 shown in FIG. 1. A differential ripple signal 302, such as the differential ripple signal 102 shown in FIG. 1 and denoted as "Vin," may be coupled to a DC restore circuit 317 and to a first differential input of a dual input instrumentation amplifier 313. A digital-to-analog converter 318 ("DAC") may produce an output voltage "Vdac" that is controlled by Q input bits. The output voltage Vdac may be coupled to a second differential input of the dual input instrumentation amplifier 313, which may develop an output voltage Vout according to the formula:

$$\text{Vout}=\text{GAIN1}*\text{Vin}+\text{GAIN2}*\text{Vdac};\qquad\text{(Equation 1)}$$

The gain coefficients GAIN1 and GAIN2 may each be non-zero and have a positive or negative value. The DAC 318 may have a bipolar output. Since Vdac may be provided by the DAC, and the ripple monitor system may be able to advantageously subtract or add a DAC generated signal component to the ripple signal 302 before it is processed by the ADC. By using a DAC with sufficient speed, and by using a proper servo signal of Q bits, the INA output may be kept optimally centered in the middle of an input voltage range of the ADC, despite the presence of unwanted mid or low frequency or DC components in the ripple signal 302. For example, if a slow voltage ramp or line frequency hum is present on the monitored power supply rail, the ripple counts may be spread out over a larger set of counters and the ripple may appear to be larger than it really is. If the DAC receives a servo signal of Q bits that tracks and subtracts the slow voltage ramp or line frequency hum by means of the second differential input of the INA, then their spreading effect on the ripple amplitudes can be suppressed and the ripple monitoring result may be much more accurate. One way to achieve such a servo signal is a digital filter which just calculates the mean of a number of ADC samples and then adjusts the DAC servo signal upwards or downwards so as to keep the mean at the midpoint of the ADC span. A digital filter is not always needed. If the voltage on the monitored power supply rail varies slowly enough, the host system could do similar calculations by software and set the DAC servo signal accordingly so as to keep the ADC samples centered at the midpoint of the ADC, or any other suitable operating point where the dynamic range of the ripple detection is optimized. The choice of the midpoint is best for ripple signals that are symmetric around a mean value, which is the most common case.

This circuit may allow both DC coupling of the ripple signal 302, in which case the DC restore circuit 317 may be inactive, or AC coupling with relatively large coupling capacitors (not shown), in which case the DC restore circuit 317 may be active. However, this circuit may not need to be able to track faster power supply ramps. In both cases, the number of required bits N of the ADC can be reduced, while still having the required resolution of the ripple signal 302.

If just removal of DC content or low frequency components, such as line frequency hum is desired, the source of the DAC servo signal Q may be a digital low pass filter.

In some applications, additional suppression of ripple components in yet another frequency band may be wanted. In this case, an additional band pass characteristic may be added to the digital filter, such that it is a combination of a low pass having a low pass band below frequency f1, and another pass band between two higher frequencies f2 and f3. By subtracting the output of this digital filter from the input ripple signal 302 by means of the DAC 318, all frequency components below f1 and between f2 and f3 may be suppressed (or at least dampened).

A high common mode rejection against common mode noise in the ripple signal may be achieved when the ripple signal 302 is coupled to Vin by a transformer. To support a transformer-coupled ripple signal, the DC restore circuit 317 may be configured to establish proper DC operating conditions at the first differential input of the dual input instrumentation amplifier 313, while presenting proper and closely matched impedances for the ripple signal 302.

Figure 4:
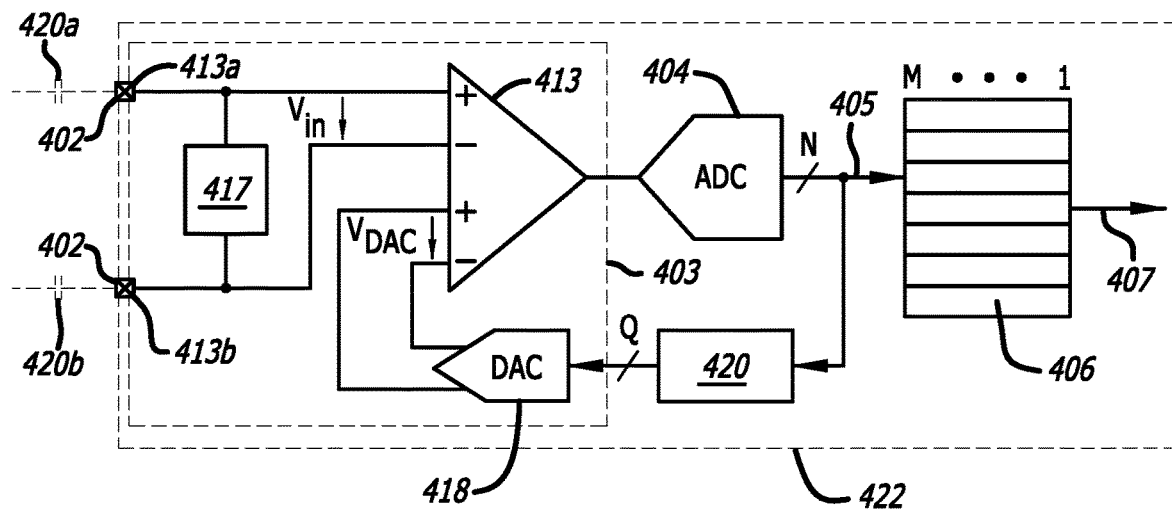
FIG. 4 illustrates an example of a ripple monitoring circuit that employs a signal conditioning circuit, such as the signal conditioning circuit shown in FIG. 3, in an integrated circuit.

FIG. 4 illustrates an example of a ripple monitoring circuit that employs a signal conditioning circuit 403, such as the signal conditioning circuit 303 shown in FIG. 3, in an integrated circuit 422. A differential ripple signal 402, which may be the ripple signal 102 shown in FIG. 1, may be received at physical IC package pins 419a, 419b. A DC restore circuit 417, which may be any of the types discussed above, may be provided to allow capacitive coupling by optional coupling capacitors 420a and 420b. Although these are shown to be external to the IC, they may instead be part of the integrated circuit 422.

A dual input INA 413 may receive the signal Vin from pins 419a and 419b, and a signal Vdac may come from a DAC 418. The INA 413 may, according to equation 1 above, produce a voltage Vout that drives an input of an N-bit ADC 404. N output bits 405 of the ADC 404 may be coupled to an amplitude statistics counter bank 406, which may provide the counts at its outputs 407, and to a digital filter 420 which may provide Q bits to an input of the DAC 418, closing a servo loop for the removal of unwanted components in the ripple signal 402. Depending on the configuration of the digital filter 420, this servo loop can be used to remove dc components from the ripple signal, track moderate speed voltage ramps by linear prediction thereof, or suppress unwanted signals in a specified bandwidth.

This architecture for a power supply ripple monitor IC may provide great flexibility in terms of ripple signal conditioning, filtering, and quantization. It may also be useful in many applications, such as for ripple monitoring in power supplies for high performance microprocessors or high density ASICs or FPGAs. It may also be useful for solar power converters and polyphase AC motor drive inverters, where the line frequency or the speed dependent reaction of the AC motor may need to be suppressed to clean up the ripple signal to the point where it may be used for health assessment of critical components, such as the electrolytic capacitor(s) on the so-called DCLINK rails of these converters/inverters.

Figure 5:
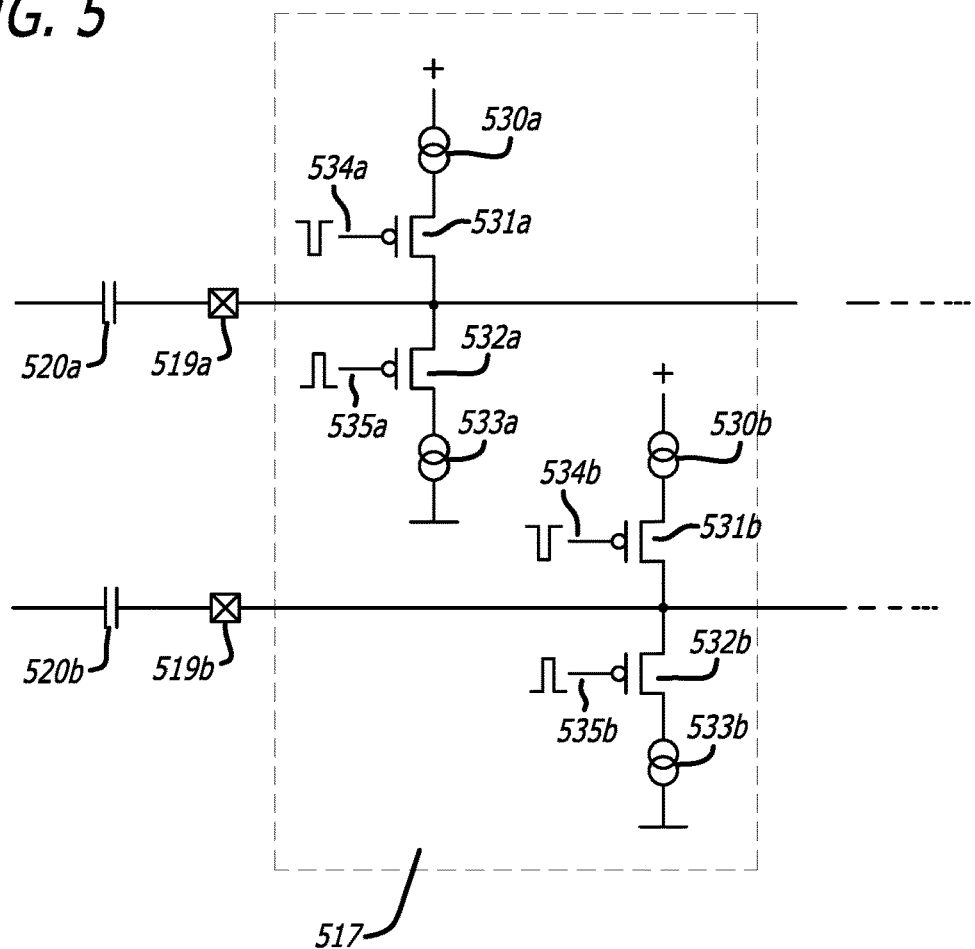
FIG. 5 illustrates an example on a prior art DC restore circuit that may be used as the DC restore circuit in FIG. 3 or 4.

FIG. 5 illustrates an example of a DC restore circuit 517 that may be used as the DC restore circuit 317 or 417 in FIGS. 3 and 4, respectively. Current sources 530a/b and 533a/b may be coupled to input pins 519a/b via MOSFET switches 531a/b and 532a/b. By turning on the switches using their respective gate signals 534a/b and 535a/b for a defined period of time, the DC bias voltages at pins 519a, 519b can be moved up and down by a defined amount, depending on the gate time, the magnitude of the current sources, and the capacitance of AC coupling capacitors 520a, 520b. These and similar circuits which can restore proper dc bias levels at AC coupled amplifier inputs are known in the art of video signal processing and any such circuit can be readily adapted to work in the context of the ripple monitoring circuits described herein.

Auxiliary circuits (not shown in the figures) may be needed to help determine whether the input stages of the amplifier that follows this DC restore circuit are in the proper range of bias voltages. These can be simple comparators. This type of DC restore circuit, when its switches are turned on, may disturb the input signal, which may cause falsification of the collected amplitude statistics. So it may be appropriate to stop the ADC conversion and amplitude counting process during the activation of this DC restore circuit. This is one of the reasons why the DAC based servo path was incorporated in this ripple detector architecture to servo out DC ramps and other unwanted signals. The DC restore circuit may only be used from time to time, when the bias voltages at the INA inputs start to creep out of range.

This ripple detector architecture based on a DAC servo loop may offer greater flexibility and less "blind times" for the ripple monitor's amplitude statistics accumulation process than otherwise possible. As long as the DAC servo loop is able to follow an input voltage ramp, such that the ripple voltage riding on the slower voltage ramp stays well centered in the span of the ADC, the accumulated amplitude statistics counts may properly convey valid information about the ripple. If the input voltage ramp is so fast that the DAC servo loop cannot follow, the signal to the ADC eventually may bring the ADC into an overrange condition, which may be counted in a counter by itself, or it may set an overrange flag. Depending on the number of ADC samples taken during such an overrange condition, the accuracy of the accumulated amplitude statistics may be more or less impaired. It may therefore be appropriate to discard the whole block of samples, clear the amplitude statistics counters, and start over after the DAC servo loop has caught up with the voltage ramp and/or after the DC restore circuit has brought back the bias voltages at pins 519a, 519b to their proper operating points.

Overrange conditions detected by the ADC may be used as a trigger to initiate or expedite these recovery procedures from fast voltage ramps. An input pin having a blanking function may be added to the ripple monitor IC or circuit. This may be activated by the host system whenever unusual voltage ramps or conditions occur on the monitored power supply rails, such as during power supply ramp up or shut down, and/or before the power supply has stabilized to its nominal value. The ripple monitor IC could use this blanking pin function to ignore any misleading ripple signals that may occur during these extreme phases of operation. This may be implemented in many ways, such as by inhibiting the amplitude statistics counting and/or by inhibiting an alert output signal whenever the blanking signal is active.

The blanking pin function could also be used to expedite the DC tracking ability of the DC restore circuit by increasing the current in the current sources 530*a/b* and 533*a/b*, as long as the blanking signal is asserted.

Many switching power supply controller ICs feature a "Power Good" signal they activate when they are in regulation, and deactivate whenever regulation is lost or during startup. Such a "Power Good" signal, or its inverted signal, could be coupled to the blanking pin function of the ripple monitor IC.

While the above teachings about the possible origins and handling of overrange conditions have been described in the context of AC coupled input signals and the DC restore circuit being active, these teachings can also be applied to a DC coupled case. In particular, the blanking pin function may be beneficial in both AC coupled and DC coupled cases.

Figure 6:
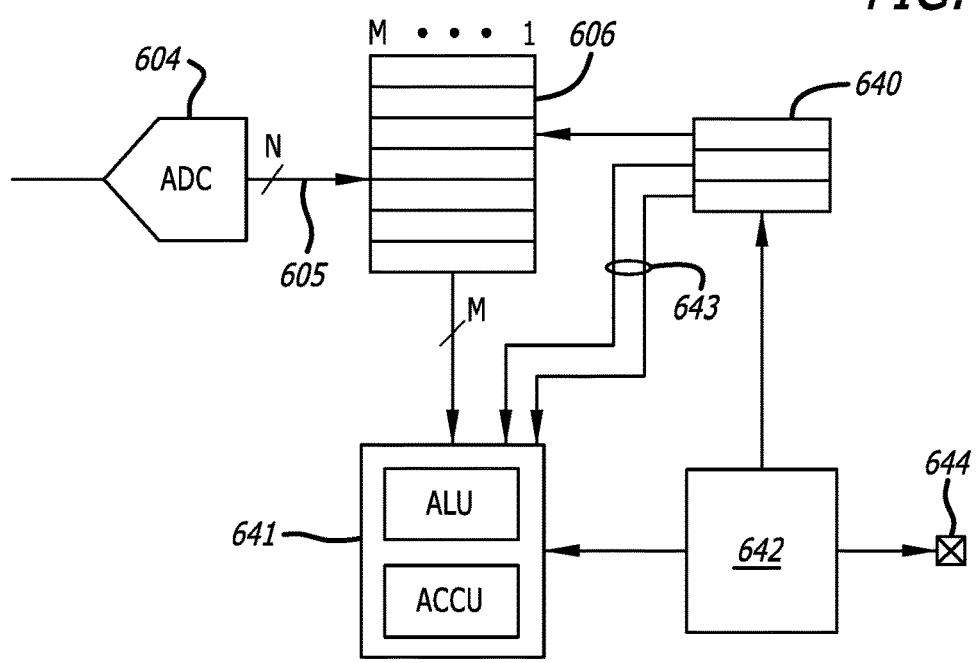
FIG. 6 illustrates an example of a circuit for advantageous ripple measurement or monitoring based on accumulated amplitude statistics.

FIG. 6 illustrates an example of a circuit for advantageous ripple measurement or monitoring based on accumulated amplitude statistics. An ADC 604 may quantize a ripple signal, outputting quantized digital codes of N bits 605. An amplitude statistics counter bank 606 may include a number of counters of M bits width. Each of the possible 2^N output codes of the ADC 604, or a subset thereof, may be assigned to a specific counter within the counter bank. Every occurrence of an output code that is assigned to a counter may increment this counter. Index registers 640 may be provided to access individual counter contents within an amplitude statistics counter bank 606. An arithmetic logic unit 641 ("ALU") with one or more accumulators ("ACCU") or scratch pad registers may receive the count selected by an index register. A control unit 642, which may be a simple state machine, may control both the index registers and the ALU/ACCU to implement a data slicing method that may help to distinguish regularly occurring ripple events from random events, such as load transients.

One possible data slicing method that may be implemented may first cycle through all the indices to determine the maximum counter contents, which may be the amplitude—or ADC output code—that occurs the most often within a block of samples and has the highest count. Then, in a second pass, the contents of the counters may be examined again and compared to a suitable fraction of the previously determined maximum count, such as 50% or 75% of it, called the "slicing level." The fractional value may be chosen depending on the desired sensitivity and known characteristics of the amplitude statistics of a properly working power supply. During the second pass, both the first and the last indices of counters whose contents are above the slicing level may be determined. This can be done by providing two latches for the index register (lower two boxes of 640). The first latch may store the index of the first occurrence of a count above the slicing level, while the second latch may store the index of any count found above the slicing level.

After cycling through all the indices, both the contents of the first and the second latches may be routed to the ALU via an auxiliary bus 643. Their difference, as calculated by the ALU, may be a measure of the ripple in the power supply system. If its value exceeds a threshold, a control unit 642 may deliver an alert signal to the host system via an alert pin 644.

Inertia may be added to avoid alarms tripping for singular or short events. The inertia may be implemented by inertia counters that count down at defined time intervals, until they reach zero. They may count up for each event, where the ripple exceeds a threshold, until the counter reaches a trigger value at which the alert may actually be given. This trigger value may be programmable to allow the host system to choose the alert inertia.

This exemplary data slicing may also be implemented by a microcontroller that is integrated on the IC, by firmware of the host system, or by any other appropriate means. The data slicing may also be modified, such as by using a moving average filter as the origin of the "slicing level," in lieu of just using the maximum count.

Figure 7:
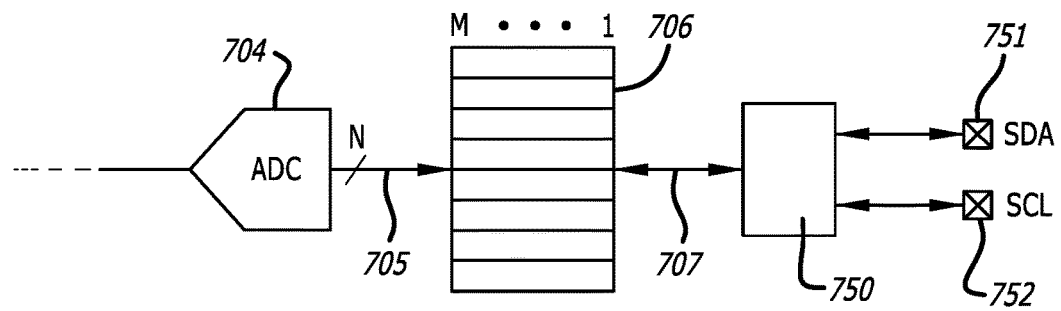
FIG. 7 illustrates another example of a ripple monitoring circuit.

FIG. 7 illustrates another example of a ripple monitoring circuit. The ripple monitoring circuit may include an ADC 704 that produces an output of N bits 705. In case the host system needs access to the amplitude statistics counters, a host interface block 750 may receive an output 707 from an amplitude statistics counter bank 706. In this example, the serial bus interface is known in the industry as the "I2C" protocol, as evidenced by the pins 751 and 752 being labeled "SDA" and "SCL," respectively. Any other type of serial or parallel bus interface may be provided instead.

Figure 8:
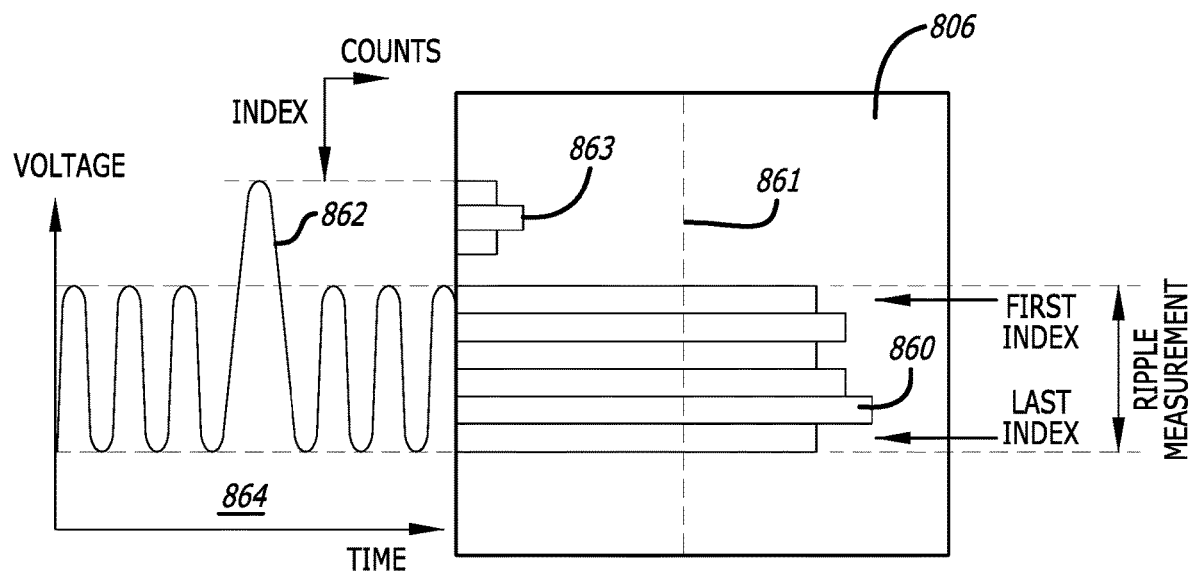
FIG. 8 illustrates an example of slicing.

FIG. 8 illustrates an example of slicing. As illustrated in this figure, a ripple signal 864 with a load transient 862 may cause a few counts 863 outside of the bulk of the counts. This may be caused by inductor current ripple in the switching power supply itself. A naïve implementation that just looks at peak values may fall prey to this load transient and may give a false alarm. But once a data slicing method is applied, the few counts caused by the load transient may be suppressed and the switching ripple amplitude may be determined.

In an amplitude statistics counter bank 806, the maximum count after a block of ADC samples having been taken may be 860, the slicing level 861 may be a fraction of it, and the difference between the first and last indices of counters with a value above the slicing level may be a measure of the switching ripple without the transient. It is possible, by not applying the slicing method, or setting the slicing level to zero, to also measure peak-to-peak ripple.

If continuous ripple monitoring is wanted, the amplitude statistics counter bank may be augmented with an amplitude statistics latch bank, into which the contents of the counters can be transferred within just a single sampling clock cycle of the ADC. This may allow working on a snapshot of the amplitude statistics at a given point of time, while the accumulation of amplitude statistics continues (if counters are not being cleared after the transfer into the latches), or a new block of amplitude samples may be taken (if counters are being cleared after the transfer into the latches).

Figure 9:
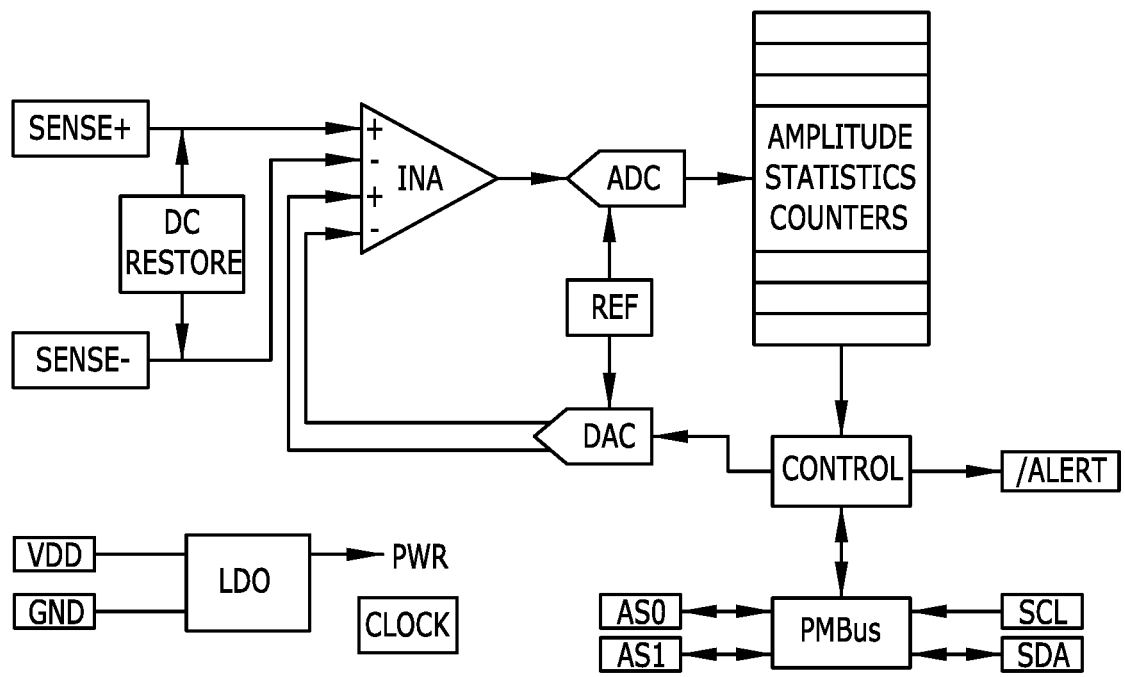
FIG. 9 illustrates an example of a ripple monitoring IC.

FIG. 9 illustrates an example of a ripple monitoring IC based on what has been described herein. All the blocks discussed above, such as ripple signal inputs (SENSE+, SENSE−), the DC restore circuit, the dual differential input INA, the ADC, the DAC, and the amplitude statistics counter bank, may be part of this IC, as illustrated in FIG. 9. The digital filter may be part of the block denoted as "CONTROL," and the serial bus interface is called "PMBus." A low dropout regulator (LDO) for the internal power supply PWR, a CLOCK generator, and a reference voltage generator REF may be added to complete the IC. SCL and SDA may be the serial bus input and output pins, and/ALERT may be the active low alert output pin.

AS0 and AS1 may be address select inputs that define the address of the IC on the serial bus. For the same number of pins on the package, one of the address select pins (i.e. AS1) may be removed to provide a blanking input pin instead. This pin may be coupled to the CONTROL section (not shown in the figure).

Figure 11:
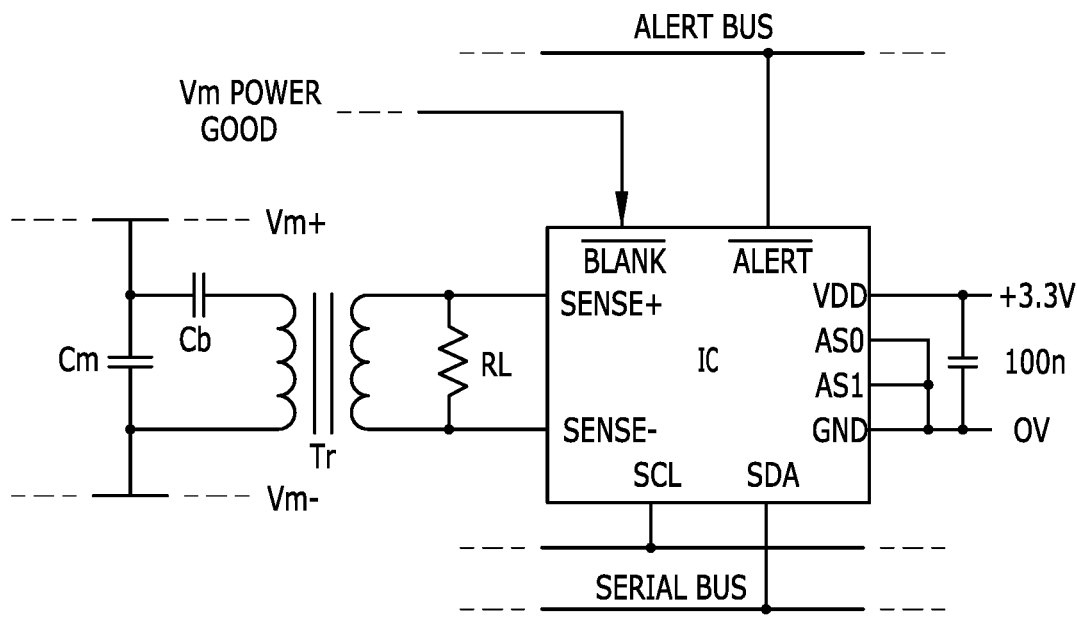
FIG. 11 illustrates an example of the ripple monitoring IC of FIG. 9 with an added blanking pin and employing transformer coupling of the ripple signal.

FIG. 11 illustrates an example of the ripple monitoring IC of FIG. 9 with an added blanking pin and employing transformer coupling of the ripple signal. The transformer coupling may provide superior common mode rejection against any parasitic common mode noise that may be present at the monitored Vm−, Vm+ power supply lines. Such common mode noise may impair the accurate measurement of the differential mode ripple voltage between the monitored Vm+, Vm− power supply lines, which may be the wanted information. In this application circuit, capacitor Cb may block the DC voltage to the primary winding of transformer Tr, and resistor RL may load the secondary winding of the transformer for best impedance matching. A "Vm power good" signal may come from a Vm power supply regulator (not shown in the figure) and may be coupled to a /BLANK input of the ripple monitoring IC. This may allow automatic suspension of the ripple monitoring process if the monitored power supply is out of proper regulation, such as during start-up and shut-down of the monitored power supply, where its ripple voltages or voltage ramps may exceed the limits for normal operation.

Many contemporary switching power supply regulator ICs, such as the LTC3866 made by Linear Technology Corporation, feature such a power good signal, typically called "PGOOD". If high voltage isolation is called for, the power good signal may be coupled to the /BLANK pin by means of an opto-coupler. Use of the /BLANK pin or a power good signal may be independent from obtaining best common mode rejection by means of the transformer.

In applications not needing blanking periods, the /BLANK pin may be tied to a voltage level which de-asserts its blanking function, such as VDD. The IC also may not have a /BLANK pin at all in some package versions, and may still retain superior common mode rejection offered by transformer coupling. Both features combined may provide superior flexibility and signal integrity however.

Figure 12:
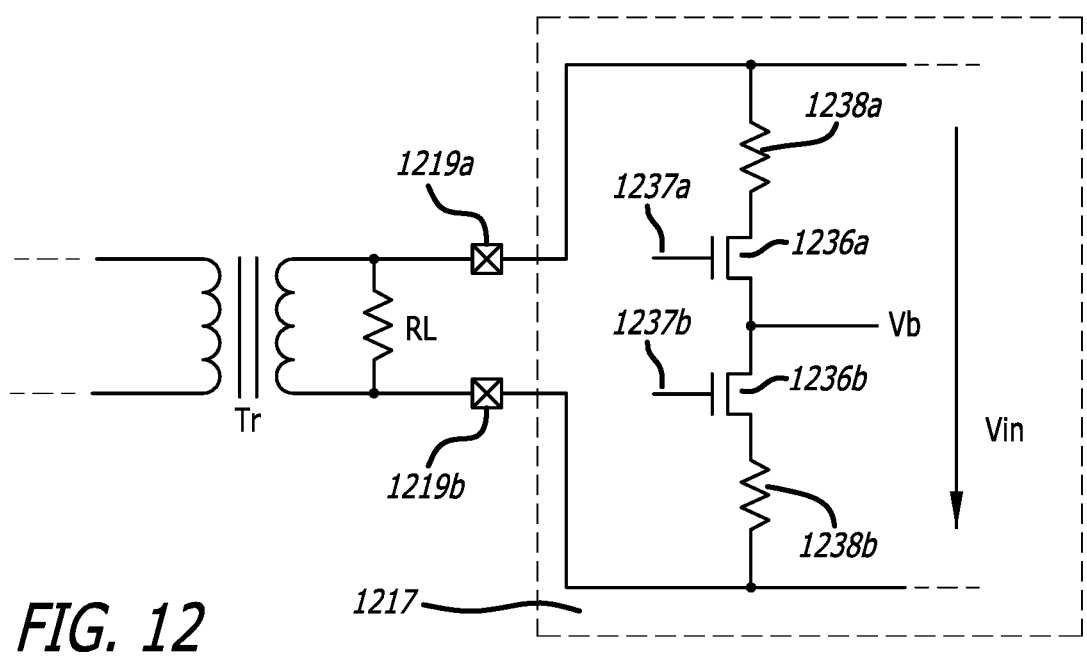
FIG. 12 illustrates an example of a DC restore circuit that may be present within a ripple monitor circuit.

FIG. 12 illustrates an example of a DC restore circuit 1217 that may be present within a ripple monitor circuit. The DC restore circuit 1217 may establish proper DC operating points at the ripple signal receiving lines coupled to pins 1219a and 1219b, while having substantially the same impedances from each of the ripple signal receiving lines to a bias voltage source node. This may be accomplished by providing bias resistors 1238a and 1238b with a first leg coupled to either input pin 1219a or 1219b and a second leg coupled to a dc bias voltage source node Vb. These bias resistors can be sized to achieve the best possible matching of their impedances, which may be better than 0.1% in contemporary semiconductor process technologies, without incurring too much silicon area penalty.

Older technologies may use laser trim, or any other trimming technique, such as zener zap, to optimize the matching of the bias resistors. The better matched these bias resistors are, the better the common mode rejection may be, until being limited by the capabilities of the instrumentation amplifier or parasitic effects.

The coupling of the bias resistors to the dc bias voltage source node Vb may be accomplished by electronic switches whose "on" state resistance also matches well and/or is much lower in magnitude than the bias resistors 1238a and 1238b, so as to achieve superior common mode rejection. In FIG. 12, the electronic switches are shown as N-MOSFET transistors 1236a and 1236b having gates 1237a and 1237b. By driving these gates to a sufficiently high gate voltage, N-MOSFET transistors of sufficient W/L ratio may be brought in an advantageous low ohmic regime of operation. By driving the gates 1237a and 1237b to a low voltage potential, the DC restore circuit 1217 may be disabled so as to allow other than transformer coupled modes of operation.

P-MOSFETs may be substituted instead or combined with N-MOSFETs to form known "transfer gate switches." In cases where the disable capability is not needed, the electronic switches may be removed and the bias resistors 1238a and 1238b directly connected to the dc bias voltage node Vb.

A bias voltage source for node Vb may be implemented as an on-chip voltage source, such as a regulator circuit or by providing an extra package pin to the ripple monitor IC, which may be coupled to a common node of bias resistors 1238a and 1238b. For higher frequencies in the range of 10-100 MHz, the variant with an extra package pin to provide Vb may bring better signal fidelity results than an internal regulator.

Another variation inheriting both concepts is an internal regulator providing bias voltage Vb whose output is coupled to both a common node of bias resistors 1238a and 1238b and to a package pin to which a bypass capacitor may be connected. If the package permits use of two pins for Vb, the second leg of either bias resistor 1238a or 1238b may each be coupled to an individual pin. If these two pins are left not connected, the transformer coupled mode of the DC restore circuit may be disabled. If these two pins are shorted, the transformer coupled mode of the DC restore circuit may be enabled. A bypass capacitor may be connected to the two shorted pins. In yet another variation, bias resistors 1238a and 1238b may be of a resistance low enough to allow removal of the load resistor RL.

Figure 13:
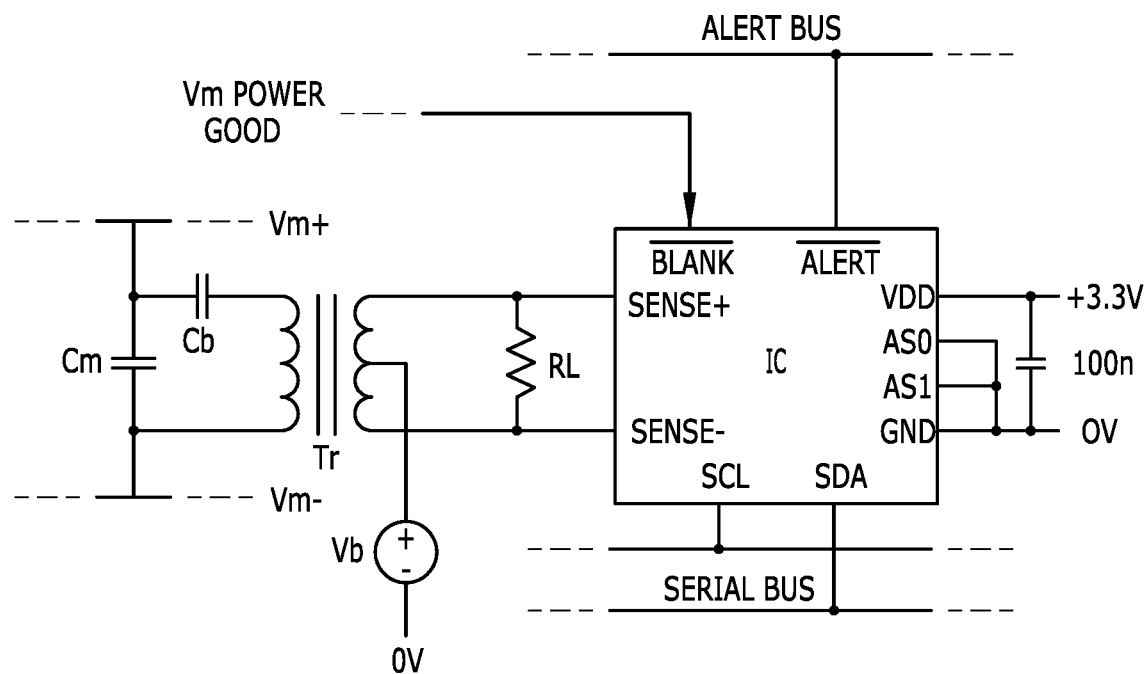
FIG. 13 illustrates an example of a transformer coupling that may be used in a ripple monitor IC that lacks the DC restore circuit of FIG. 12.

FIG. 13 illustrates an example on how a transformer coupling may be implemented for a ripple monitor IC that lacks the DC restore circuit of FIG. 12. This variation may also find use if an integrated DC restore circuit is present, but happens to fall out of compliance with special case input impedance requirements which may occasionally arise. In this case, it may be required to disable or remove the internal DC restore circuit and provide the input bias voltage network externally to the IC. To this end, instead of a four node transformer, FIG. 13 shows a five node transformer having a split secondary winding, also known as a "Balun transformer." The center tap of such a Balun transformer may be coupled to a dc bias voltage source Vb, which may be a voltage regulator or any known combination of resistors and bypass capacitors. For example, Vb may be provided by a resistive divider between VDD and GND, and a bypass capacitor coupled between Vb and GND.

Another variation of FIG. 13 may avoid the costs of the center tap of the secondary winding, use a four node transformer, and provide a center tap on the load resistor RL, in lieu of the missing transformer center tap. Such a load resistor center tap may also be coupled to a dc bias voltage source Vb. However, the two sections of RL may need to match well enough to achieve the desired common mode rejection, which may call for more costly precision resistors.

While these variations of the circuit in FIG. 13 may be useful in some applications, the circuit of FIG. 11 with the DC restore circuit of FIG. 12, when used with transformer specifications it is optimized for, may provide superior common mode rejection and signal fidelity in the general case.

Figure 10:
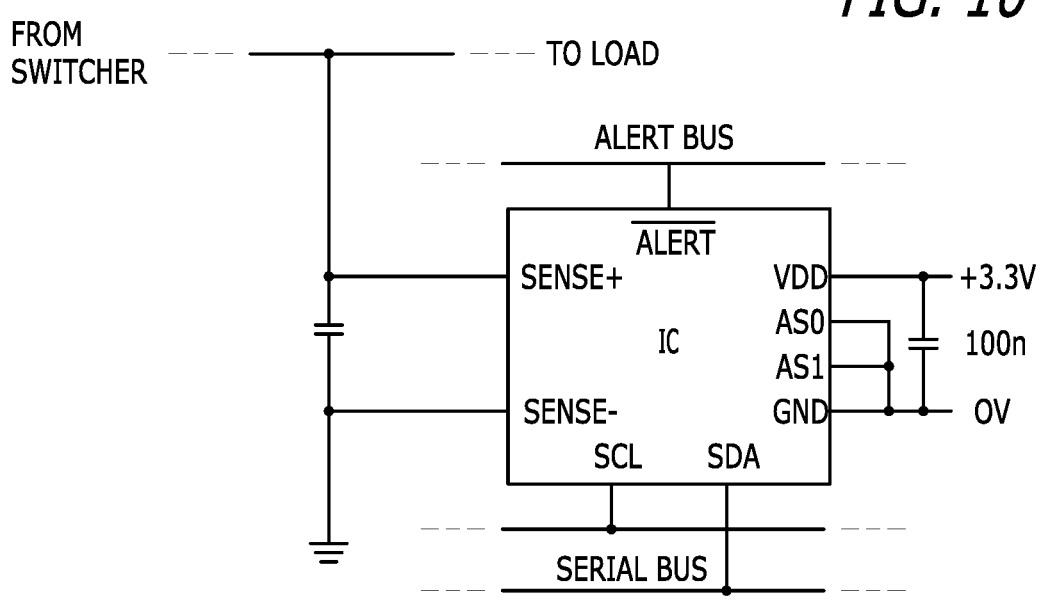
FIG. 10 shows an example application circuit for the ripple monitoring IC of FIG. 9.

FIG. 10 shows an example application circuit for the ripple monitoring IC of FIG. 9. A power supply rail to be monitored may run from a switching power supply to a load. The monitored power supply rail may be buffered to power supply ground by a buffer capacitor. The monitored ripple may be present across this buffer capacitor and may be coupled to SENSE+, SENSE− pins of a ripple monitor IC.

In the example, DC coupling is shown, but AC coupling capacitors may be added between the buffer capacitor and the SENSE+, SENSE− pins.

The ripple monitor IC may be connected to a serial bus and to an ALERT bus. It may also be connected to its own power supply voltage and its own buffer capacitor by its VDD and GND pins. This power supply voltage may come from an independent power supply, or from the power supply to be monitored. Address select inputs AS0 and AS1 may be tied to ground to select one of several addresses on the serial bus. They could also be tied to VDD, be left open, or tied to other pins according to one of the many known serial bus address select schemes. Once configured via the serial bus, the IC may begin monitoring the ripple and pull the /ALERT pin whenever the ripple exceeds programmed or pre-set thresholds.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

In some cases having only slowly varying voltage levels on the monitored power supply, the digital filter may be substituted by software running on the host system, which via the serial bus may read and then analyze the contents of the amplitude statistics counters for being centered in the span of the ADC, and adjust the servo signal to the DAC via the serial bus so as to keep the centering. In some cases with very precisely regulated power supplies or if only AC coupled operation is needed, the DAC and could be removed and the instrumentation amplifier INA could be a single differential input instrumentation amplifier, which is equivalent to setting the GAIN2 in equation 1 above to zero. If the monitored power supply has a sufficiently low common mode noise level compared to the ripple signal to be monitored, the instrumentation amplifier can be substituted with an operational amplifier. The DC restore circuit and any other signal conditioning circuits described above may not be integrated in a ripple monitor IC, but be implemented by equivalent discrete circuitry outside of the ripple monitor IC. The configuration of the ripple monitoring process, such as setting of the gain of the INA, and setting the alert threshold or other parameters of the ripple monitoring process, such as number of ADC samples taken before each analysis of the amplitude statistics counts, in lieu of being programmed via a serial bus, may use configuration pins on a ripple monitor IC which may be connected to VDD or GND or other configuration pins, either directly or through resistors or resistor networks, to select a particular configuration without any host system interaction. Inertia counters could count down from a start count defining the inertia instead of counting up.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A ripple monitoring circuit for generating information indicative of a failing component in a power supply, the ripple monitoring circuit comprising:
   at least one input that receives a ripple signal from the power supply that has a ripple component;
   a quantization circuit that quantizes an amplitude of the ripple component based on the ripple signal, the quantization circuit outputs a digital signal; and
   a ripple amplitude statistics counter bank comprising a plurality of counters, the ripple amplitude statistics counter bank being configured to receive the digital signal from the quantization circuit and, based on the digital signal, count and store a value representing the number of times that different quantized amplitudes or different ranges of quantized amplitudes of the ripple component occurred.

2. The ripple monitoring circuit of claim 1 wherein the quantization circuit includes an analog-to-digital converter that repeatedly converts the ripple component, each time into a digital word representative of the amplitude of the ripple component at the time of the conversion.

3. The ripple monitoring circuit of claim 2 wherein the ripple amplitude statistics counter bank maintains a count of the number of times that the ripple component is converted into each of the digital words.

4. The ripple monitoring circuit of claim 1 further comprising a signal conditioning circuit that conditions the ripple signal before it is counted by the ripple amplitude statistics counter bank.

5. The ripple monitoring circuit of claim 4 wherein the signal conditioning circuit includes a transformer.

6. The ripple monitoring circuit of claim 4 wherein the signal conditioning circuit includes a digital-to-analog converter having an output that is added to or subtracted from the ripple signal.

7. The ripple monitoring circuit of claim 4 wherein:
the ripple signal is a differential signal; and
the signal conditioning circuit includes:
a digital-to-analog converter that converts an input digital signal $V_{in}$ into a differential analog output $V_{DAC}$; and
a dual input instrumentation amplifier that:
has a first pair of differential inputs that receives the differential signal of the ripple signal;
has a second pair of differential inputs that receives the differential analog output $V_{DAC}$ from the digital-to-analog converter; and
produces an output that is equal to the sum of Vin time a non-zero gain factor and Vdac times a non-zero gain factor.

8. The ripple monitoring circuit of claim 7 wherein the signal conditioning circuit includes a digital filter that filters out unwanted ripples in the ripple signal, thereby preventing the amplitudes of these unwanted ripples from being counted by the ripple amplitude statistics counter bank.

9. The ripple monitoring circuit of claim 8 wherein the digital filter includes a low pass filter that filters out DC or low frequency ripples in the ripple signal.

10. The ripple monitoring circuit of claim 8 wherein the digital filter predicts linear voltage ramps to enable suppression of them.

11. The ripple monitoring circuit of claim 8 wherein the digital filter includes a low pass filter and a band pass filter.

12. The ripple monitoring circuit of claim 4 wherein the signal conditioning circuit includes a DC level restore circuit.

13. The ripple monitoring circuit of claim 12 wherein the DC level restore circuit includes switchable current sources coupled to the at least one input that receives the ripple signal.

14. The ripple monitoring circuit of claim 12 wherein the DC level restore circuit includes one or more bias resistors, each being coupled between the ripple signal and a bias voltage.

15. The ripple monitoring circuit of claim 14 wherein each bias resistor is coupled to a bias voltage by an electronic switch.

16. The ripple monitoring circuit of claim 1 wherein the digital signal output by the quantization circuit includes a plurality of bits, wherein a first counter of the plurality of counters is assigned to a first combination of the plurality of bits, and wherein a second counter of the plurality of counters is assigned to a second combination of the plurality of bits, the second combination being different from the first combination.

17. The ripple monitoring circuit of claim 1 further comprising computational circuitry that analyzes the value generated by the ripple amplitude statistics counter to determine whether a component in the power supply is failing.

18. The ripple monitoring circuit of claim 17 wherein the computational circuitry determines an amplitude slicing level below which counts of the amplitudes are ignored when determining whether a component in the power supply is failing.

19. The ripple monitoring circuit of claim 1, wherein the quantization circuit is configured to generate a plurality of output codes based on the digital signal, wherein a first of the plurality of counters is incremented on occurrence of a first code of the plurality of output codes, and wherein a second of the plurality of counters is incremented on occurrence of a second code of the plurality of output codes, the second code being different from the first code.

20. The ripple monitoring circuit of claim 17 wherein the computational circuitry issues an alert when it determines that a component in the power supply is failing.

21. The ripple monitoring circuit of claim 20 wherein the computational circuitry:
includes at least one inertia counter that increments for each ripple amplitude count that exceeds an alert threshold; and
issues an alert when the inertia counter reaches a threshold count.

22. The ripple monitoring circuit of claim 21 wherein the inertia counter decrements at time intervals until it reaches zero.

23. The ripple monitoring circuit of claim 1 wherein the ripple monitoring circuit includes a blanking input that, when enabled, stops the ripple amplitude statistics counter bank from continuing to count the number of times that each different quantized amplitude of the ripple component occurred.

24. A method for generating information about a power supply, the method comprising:
receiving a ripple signal from a power supply that has a ripple component;
quantizing an amplitude of the ripple component based on the ripple signal to generate a digital signal; and
counting and storing, based on the digital signal using a ripple amplitude statistics counter bank comprising a plurality of counters, a value representing the number of times that different quantized amplitudes or different ranges of quantized amplitudes of the ripple component occurred.

25. The method of claim 24, wherein the amplitude is repeatedly quantized, and wherein a plurality of output codes correspond to the digital signal, further comprising:
incrementing a first of the plurality of counters on occurrence of a first code of the plurality of output codes; and
incrementing a second of the plurality of counters on occurrence of a second code of the plurality of output codes, the second code being different from the first code.

26. An apparatus for generating information about a power supply, the apparatus comprising:
means for receiving a ripple signal from a power supply that has a ripple component;

means for quantizing an amplitude of the ripple component based on the ripple signal to generate a digital signal; and means for counting and storing, based on the digital signal using a ripple amplitude statistics counter bank comprising a plurality of counters, a value representing the number of times that different quantized amplitudes or different ranges of quantized amplitudes of the ripple component occurred.

27. The apparatus of claim 26, wherein the amplitude is repeatedly quantized, and wherein a plurality of output codes correspond to the digital signal, further comprising:

means for incrementing a first of the plurality of counters on occurrence of a first code of the plurality of output codes; and means for incrementing a second of the plurality of counters on occurrence of a second code of the plurality of output codes, the second code being different from the first code.

* * * * *